(12) United States Patent
Turner

(10) Patent No.: US 10,955,449 B2
(45) Date of Patent: Mar. 23, 2021

(54) SENSOR AND METHOD OF MANUFACTURING SAME

(71) Applicant: Weston Aerospace Limited, Farnborough (GB)

(72) Inventor: Nigel Turner, Farnborough (GB)

(73) Assignee: WESTON AEROSPACE LIMITED, Farnborough (GB)

(*) Notice: Subject to any disclaimer, the term of this patent is extended or adjusted under 35 U.S.C. 154(b) by 45 days.

(21) Appl. No.: 16/116,253

(22) Filed: Aug. 29, 2018

(65) Prior Publication Data

US 2019/0064237 A1   Feb. 28, 2019

(30) Foreign Application Priority Data

Aug. 31, 2017 (GB) ..................... 1713987

(51) Int. Cl.
*G01R 27/02* (2006.01)
*H03K 17/955* (2006.01)
(Continued)

(52) U.S. Cl.
CPC ............ *G01R 27/02* (2013.01); *G01D 11/245* (2013.01); *H03K 17/955* (2013.01);
(Continued)

(58) Field of Classification Search
CPC ..... G01D 11/245; H03K 17/955; H05K 1/185
See application file for complete search history.

(56) References Cited

U.S. PATENT DOCUMENTS 5,724,727 A   3/1998   Chopra et al.
5,760,593 A   6/1998   Lawrence et al.
(Continued)

FOREIGN PATENT DOCUMENTS

DE   102016006484 A1   12/2016
WO   2016142147 A1   9/2016
WO   2017124200 A2   7/2017

OTHER PUBLICATIONS

European Search Report dated Feb. 1, 2019 for related EP Application No. 18191829.3, 9 pgs.
(Continued)

*Primary Examiner* — Alvaro E Fortich
(74) *Attorney, Agent, or Firm* — Fredrikson & Byron, P.A.

(57) ABSTRACT

The present invention relates to a method of manufacturing a sensor for a high-temperature environment. The method comprises the steps of: depositing an electrically insulating material (108) to form at least one portion of a layer (112); depositing an electrically conductive material (110) to form at least one further portion of the layer (112); depositing successive layers (112), each layer being formed of the electrically insulating material (108) and/or the electrically conductive material (110), wherein the electrically conductive material (110) in each layer is deposited on at least a portion of the electrically conductive material (110) in the previous layer so as to form at least one electrically continuous portion extending through the layers; and fusing the materials. The invention further relates to a sensor for a high-temperature environment comprising: at least one electrically conductive portion; and at least one electrically insulating portion, encapsulating the or each electrically conductive portion. The or each electrically conductive portion and the or each electrically insulating portion are fused to form a monolithic body.

17 Claims, 8 Drawing Sheets

(51) Int. Cl.
    *G01D 11/24*     (2006.01)
    *H05K 1/02*     (2006.01)
    *H05K 1/18*     (2006.01)
    *H03K 17/96*     (2006.01)
    *F01D 21/00*     (2006.01)
    *F01D 17/02*     (2006.01)
    *F01D 11/20*     (2006.01)
    *G01B 7/14*     (2006.01)

(52) U.S. Cl.
    CPC ........... *H05K 1/0298* (2013.01); *H05K 1/185* (2013.01); *F01D 11/20* (2013.01); *F01D 17/02* (2013.01); *F01D 21/003* (2013.01); *F05D 2230/31* (2013.01); *G01B 7/14* (2013.01); *H03K 2017/9606* (2013.01); *H03K 2217/96078* (2013.01); *H03K 2217/960705* (2013.01); *H03K 2217/960755* (2013.01)

(56) References Cited

U.S. PATENT DOCUMENTS

| | | |
|---|---|---|
| 7,023,205 B1 | 4/2006 | Krupp |
| 2009/0056416 A1* | 3/2009 | Nair ................... G01N 15/0656 73/28.01 |
| 2009/0294285 A1* | 12/2009 | Nair ................... G01N 27/4067 204/431 |
| 2010/0171792 A1* | 7/2010 | Sidhu ................... B29C 64/106 347/44 |
| 2013/0033256 A1 | 2/2013 | Thelemann et al. |
| 2014/0049276 A1 | 2/2014 | De Boer et al. |
| 2014/0296403 A1* | 10/2014 | Ota ......................... C08L 67/02 524/186 |
| 2015/0098161 A1* | 4/2015 | Horowy ................... H02H 9/02 361/87 |
| 2015/0145348 A1 | 5/2015 | Preg et al. |
| 2015/0173203 A1 | 6/2015 | Din |
| 2015/0201500 A1 | 7/2015 | Shiner et al. |
| 2015/0242612 A1* | 8/2015 | Moberg ................. G06F 3/0487 726/2 |
| 2016/0039145 A1 | 2/2016 | Steiner |
| 2016/0278200 A1 | 9/2016 | Costes |
| 2017/0064415 A1* | 3/2017 | Berkcan ................... H04Q 9/00 |

OTHER PUBLICATIONS

Search Report for related British Application No. GB1713987.4, dated Feb. 23, 2018, 5 pages.

\* cited by examiner

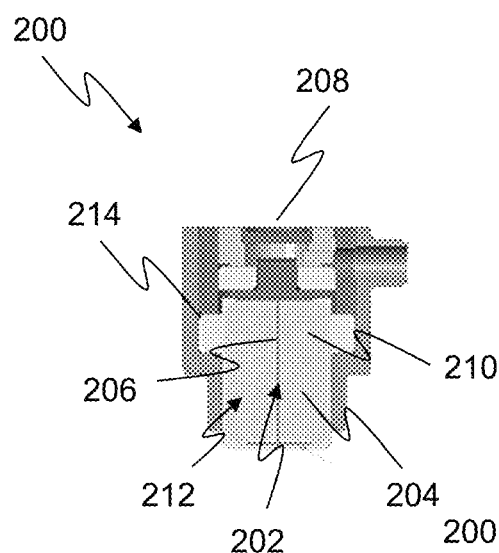
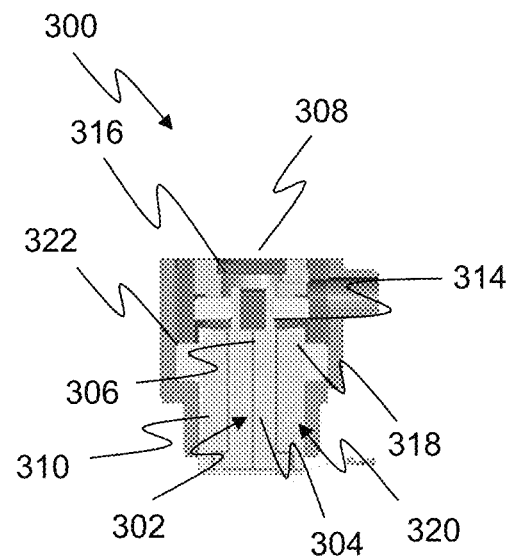
Figure 2a             Figure 3a
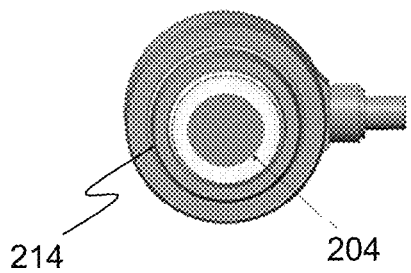
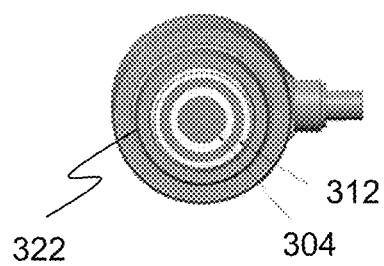
Figure 2b             Figure 3b

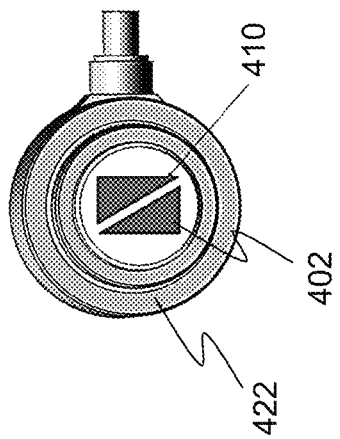
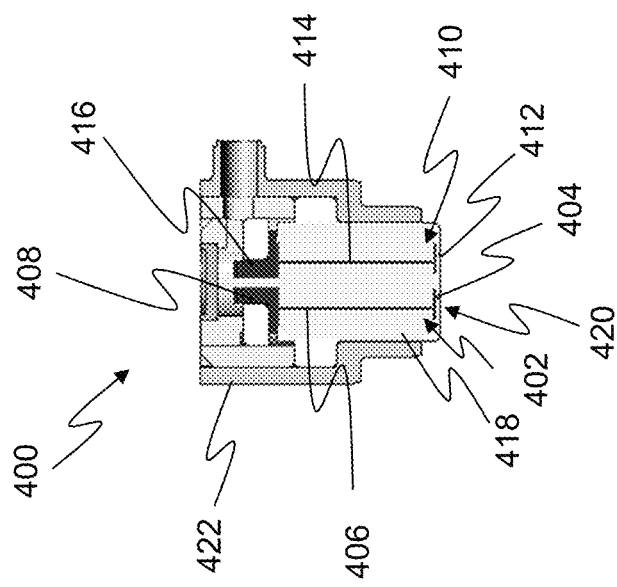

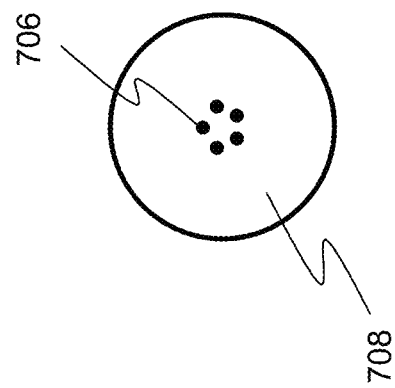
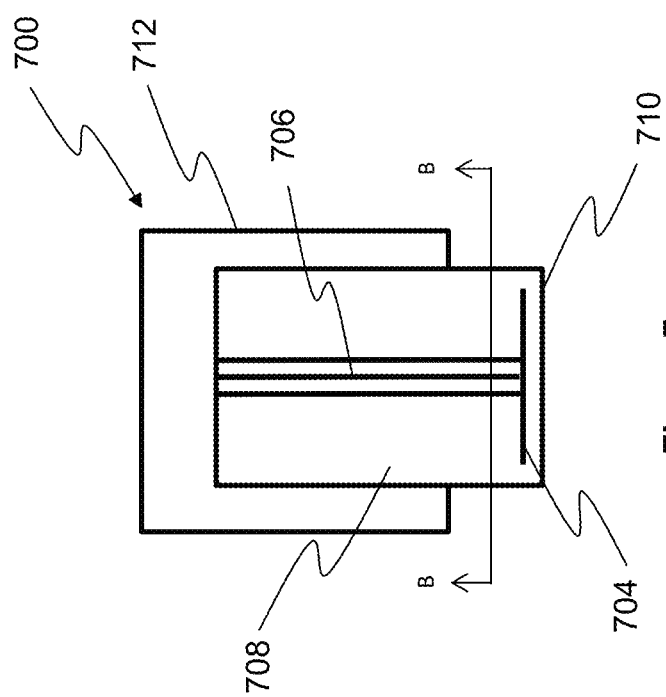
Figure 7b
Figure 7a

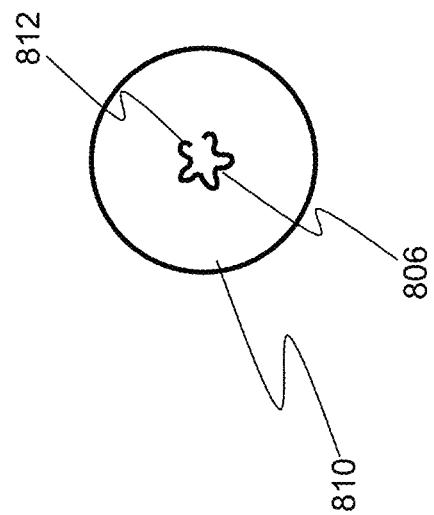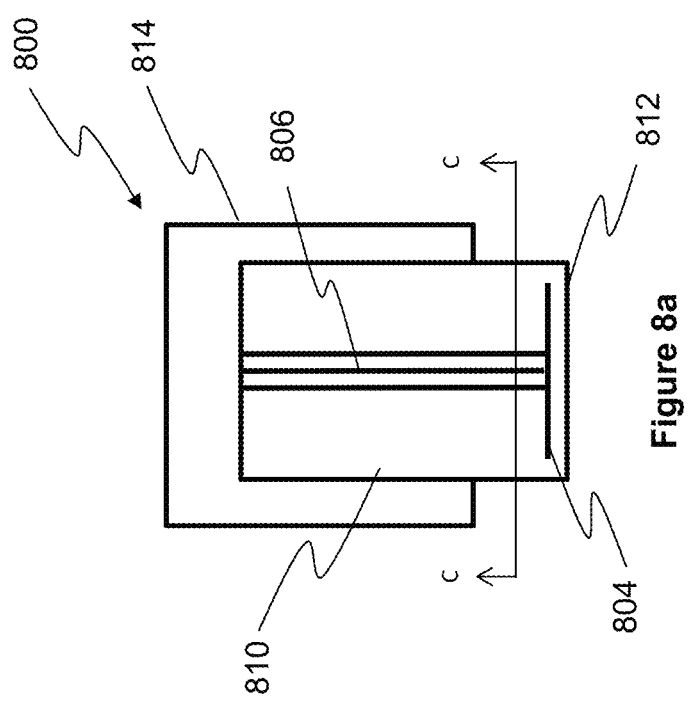

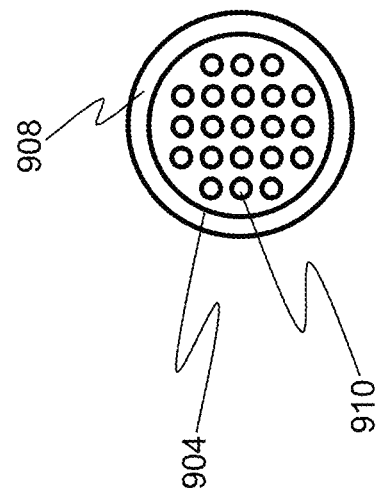
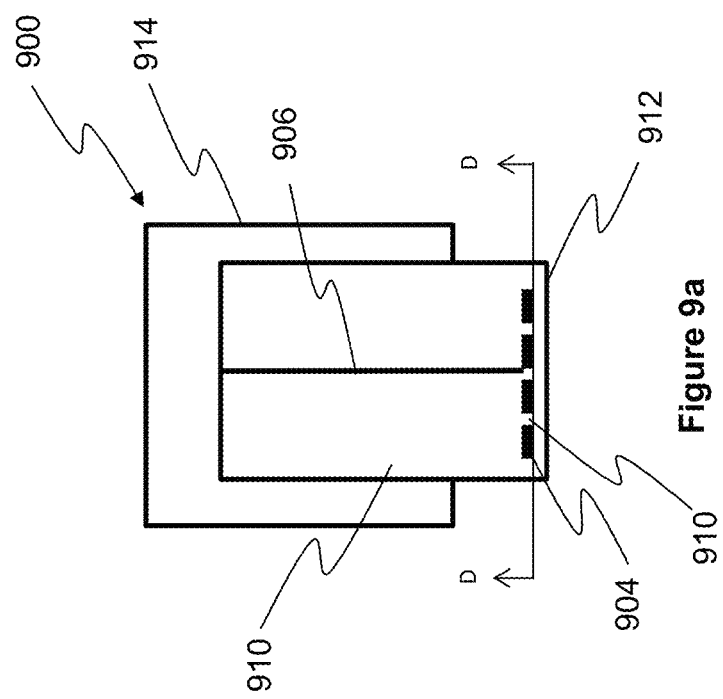
Figure 9b
Figure 9a

SENSOR AND METHOD OF MANUFACTURING SAME

RELATED APPLICATIONS

This application claims priority to British Application No. 1713987.4, filed Aug. 31, 2017, which is incorporated by reference herein in its entirety.

DESCRIPTION

The present invention is concerned with a method of manufacturing a sensor for a high-temperature environment, and with the sensor manufactured by the method. In particular, the invention is concerned with a method of additive manufacture of sensors for use in gas turbines, such as for measuring blade tip clearance or timing.

The environment in which the sensors of the present invention are used is high-temperature, high thermal-shock and large thermal gradients from the front face, tip, of the sensor along the longitudinal length. Typical sensors may be an inductive-type sensor or a capacitive-type sensor.

Known sensors suitable for such a hostile environment are manufactured using discrete parts. For example, for inductive sensors, it is known to form a coil of electrically conductive wire around a former, and then embed the coil in a non-conductive insulator within a housing. U.S. Pat. No. 7,023,205 describes one such sensor manufactured in this way.

In another example, for capacitive sensors, it is known to form an electrode, either from a solid body of metal or from electrically conductive ceramics. The electrode is then surrounded by an electrically insulating material, such as a ceramic. In one example described in U.S. Pat. No. 5,760,593, the capacitive sensor is manufactured by forming an electrode in a conventional manner, and then surrounding the electrode in an electrically insulating material by a deposition process. In addition, the capacitive sensor may be provided with a shield to protect the electrode from the physical environment in which it is installed, such as in a gas turbine, and to electrically shield the electrode from inputs other than those of interest.

Despite such sensors being designed for this hostile environment, the durability of the sensor, and therefore the expected time to failure, is not sufficient. Sensors manufactured in accordance with known techniques are prone to damage from the hostile thermal and vibrational environment. The differing coefficients of thermal expansion, thermal transfer rates and thermal masses of each component in the sensor cause stresses within the sensor assembly, which, over time, cause failure.

It is therefore an object of the present invention to provide a method of manufacturing sensors for hostile, high temperature and high vibration, environments, which have improved durability and an increased expected time to failure.

According to a first aspect of the present invention, there is provided a method of manufacturing a sensor for a high-temperature environment. The method comprises the steps of: depositing one or more electrically insulating material to form at least one portion of a layer with low electrical conductivity; depositing one or more electrically conductive material to form at least one further portion of the layer with high electrical conductivity;

depositing successive layers, each layer being formed of portions of high electrical conductivity and low electrical conductivity, wherein the electrically conductive material or materials is or are deposited on at least a segment of the electrically conductive material or materials in the previous layer so as to form at least one path of high electrical conductivity extending through the layers, said at least one path of high electrical conductivity defining: at least one electrode or at least one coil; and at least one elongate portion extending from said at least one electrode or said at least one coil; and fusing the materials to form a monolithic structure. The electrically insulating material is deposited such that the at least one elongate portion is shielded from the external environment.

Advantageously, providing such a method to manufacture sensors using an additive process enables a more durable sensor to be provided. By manufacturing the sensor in such a way that all components are fused together, the stresses caused by differing thermal coefficients of expansion can be reduced or substantially eliminated. Furthermore, by depositing the electrically insulating material to form, in effect, a protective housing which is exposed to the external environment (such as a turbine exhaust gas) enables a sensor for a high temperature. In this way, any suitable type sensor may be formed in dependence on the application.

Throughout the present specification, the terms wire, conductive path and conductive elongate portion may be used interchangeably to refer to a segment of the elongate portion defined by the at least one path of high electrical conductivity in accordance with the first aspect recited above.

Preferably, the method further comprises depositing one or more electrically insulating material to form one or more initial continuous layers of low electrical conductivity, the continuous layer or layers forming a front face of the sensor. Providing such a front face of the sensor, that is to say the face of the sensor directly exposed to the high-temperature environment, enables the electrically continuous portion to be shielded from that environment and therefore further improve the durability of the sensor.

The electrically conductive material or materials may be deposited in such a way as to form at least one electrically continuous coil extending through the layers. Preferably, the longitudinal axis of the coil is substantially aligned with the longitudinal axis of the sensor. As used herein, the term "longitudinal" refers to the direction extending along the main axis of the sensor from the front face to the rear face, and the term "transverse" refers to the direction perpendicular to that longitudinal direction.

The layers are preferably formed in successive planes substantially transverse to the longitudinal axis of the sensor.

The electrically conductive material or materials may be deposited in such a way as to form a plurality of paths of high electrical conductivity extending through the layers. In this way various forms, and types, of sensor can be manufactured.

The electrically conductive material or materials may be deposited in such a way as to form a path of high electrical conductivity extending through the layers, where the cross-sectional shape of said path has a curved profile or contour, which may form either an open or closed shape. Also in this way, various forms, and types, of sensor can be manufactured.

The coil may have any number of turns as appropriate for the particular sensor, for example three, four, five, six, seven, eight or more.

The electrically conductive material or materials may be deposited in such a way as to form at least one electrode extending through the layers. The electrically conductive material or materials may be deposited in such a way as to form a guard around the electrode. The electrode may comprise a plate portion, and a wire portion coupled to the plate portion. The plate portion is preferably configured to be adjacent the, where present, front face of the sensor formed from the electrically insulating material. The plate portion is preferably in a plane substantially transverse to the longitudinal axis of the sensor. The plate portion may be formed by a plurality of layers, or may be formed by a single layer. The plate portion may be circular, triangular, square or any other suitable shape. The plate portion may comprise one or more through holes or slots and the material of low electrical conductivity may fill such holes or slots. Where the plate portion comprises through holes or slots, the plate may be formed by depositing one or more layers of electrically conductive material in the form of a matrix, before being fused to form the monolithic structure.

The electrically conductive material or materials may be deposited to form two or more electrodes. In one embodiment, the electrically conductive material is deposited to form two electrodes, the electrodes being substantially triangular, preferably right-angled triangles, preferably of substantially equal dimensions. Preferably, the substantially triangular electrodes are arranged such that the hypotenuse of each triangle are parallel to each other. In this case, the substantially triangular electrodes are preferably arranged such that the corresponding edges of each triangle are substantially parallel to each other.

The electrically conductive material or materials may be deposited to form at least one electrode, and a shield surrounding the at least one electrode. The electrically insulating material or materials is or are preferably deposited between the electrode and the shield to maintain electrical separation. In this embodiment, the electrode is preferably substantially circular, and the shield is preferably a substantially circular ring.

The electrically conductive material or materials may be deposited in such a way as to form at least one electrical contact pad. Preferably, an electrical contact pad is formed for each of the electrically continuous portions provided in the sensor. Preferably, the or each contact pad is in electrical connection with a corresponding electrode or coil. In this way, the sensor formed according to the method of the present invention may be more easily electrically coupled to control electronics for monitoring the output of the sensor.

The electrically conductive material or materials that form the at least one elongate portion may electrically connect the at least one electrode or the at least one coil to the at least one electrical contact pad.

The materials forming the sensor may be deposited as a powder, the powder being extruded through nozzles. The powder may be pressurised and deposited through a nozzle to form the at least one portion of the layer. The method preferably comprises controlling the position of the nozzle to deposit the material in a predefined arrangement to form the or each portion of each layer. The nozzle is preferably positionable within a plane parallel to the layers of the sensor, and a base on which the layers are deposited is preferably positionable in a direction perpendicular to the base. In this way, the base is moved in a direction away from the nozzle after each layer is deposited. Alternatively, the base may be stationary, and the nozzle may move in the direction perpendicular to the layers.

The material or materials forming the sensor may be provided within a liquid carrier, and deposited as a liquid. The liquid may be pressurised and deposited through an injector. The injector may be a print-head injector, such as a piezoelectric nozzle, and as such the materials may be deposited by printing. The method preferably comprises controlling the position of the nozzle to deposit the material in a predefined arrangement to form the or each portion of each layer. Similarly to depositing the materials as a powder, the injector/nozzle is preferably positionable within a plane parallel to the layers of the sensor, and a base on which the layers are deposited is preferably positionable in a direction perpendicular to the base. In this way, the base is moved in a direction away from the nozzle after each layer is deposited. Alternatively, the base may be stationary, and the injector/nozzle may move in the direction perpendicular to the layers. Such a process is known as 3D printing.

A binding agent may be deposited to bind the deposited electrically insulating material and the electrically conductive material prior to the materials being fused. Such a binding agent may enable all of the layers required to form the sensor to be deposited before fusing the materials together. This may enable the process to be more efficient. Before the step of fusing the materials, the method may further comprise heating the deposited materials to burn off the binder. In this embodiment, the electrically insulating material and the electrically conductive material are preferably deposited through nozzles, as described above.

The electrically insulating material or materials and the electrically conductive material or materials of each layer may be deposited substantially simultaneously. The materials may be deposited using two nozzles, coupled together. Alternatively, the materials may be deposited sequentially. The electrically insulating material or materials and the electrically conductive material or materials of each layer may be deposited substantially simultaneously at some sections of a layer, and sequentially at other sections of the layer.

The electrically insulating material or materials and the electrically conductive material or materials preferably have similar coefficients of thermal expansion.

The step of fusing the materials preferably comprises sintering the materials. The step of fusing the materials preferably includes fusing the electrically insulating material together, fusing the electrically conductive material together, and fusing the electrically insulating material with the electrically conductive material. In this way, an essentially monolithic structure is manufactured. Sintering or melting the or each material may use one or more of: a laser; and an electron beam. Preferably, the electrically insulating material or materials and the electrically conductive material or materials have similar sintering temperatures.

The method may further comprise the step of fusing the or each material in each layer before depositing each successive layer. The step of fusing the or each material in each layer preferably comprises sintering or melting the or each material using one of: a laser; and an electron beam.

The electrically insulating material is preferably a ceramic. The electrically insulating ceramic material is preferably electrically insulating at high temperature, and at least up to about 800 degrees C., more preferably up to about 1,000 degrees C., yet more preferably up to about 1,100 degrees C. The electrically insulating ceramic material is preferably electrically insulating at high temperature, and may retain the electrically insulating property in excess of 1,100 degrees C. The ceramic material is preferably resistant to thermal shock, and has mechanical properties suitable for being used in a gas turbine. The electrically insulating ceramic material may be any one of: alumina; silicon nitride; aluminium nitride; and SiAlONs. SiAlONs are ceramic alloys based on the elements silicon (Si), aluminium (AD, oxygen (O) and nitrogen (N). Any other suitable electrically insulating material may be used.

The electrically conductive material may be a metal, preferably with a high melting point. The electrically conductive metal material may be one of: tungsten; platinum; and iridium. Alternatively, the electrically conductive material may be an electrically conductive ceramic. The electrically conductive ceramic may be silicon carbide. The silicon carbide may be formed as a n-type semiconductor doped with one of: nitrogen and phosphorus. Alternatively, the silicon carbide may be formed as a p-type semiconductor doped with one of: aluminium; boron; gallium; and beryllium. The silicon carbide preferably has a high, may be degenerate doping concentration. The electrically conductive ceramic may alternatively be one of: titanium nitride; and molybdenum-disilicide. Any other suitable electrically conductive material may be used.

The electrically insulating material and the electrically conductive material are preferably chosen such that they have compatible sintering temperatures.

The method may further comprise coupling the fused layers of electrically insulating material and electrically conductive material to a housing. The housing is preferably adapted to be coupled to the casing of a gas turbine.

Sensors manufactured according to the method of the present invention find particular application in gas turbines, such as jet engines for aircraft. Advantageously, the sensors may be used in a closed loop control system to control the gap between the turbine blades and the casing. In this way, the fuel efficiency of the engine may be improved. To improve the accuracy of such sensors, the end face of the sensor is exposed to the gas stream which may have a temperature of 1100 degrees C., or more, and thus experiences large thermal shocks. In addition, sensors used in a jet engine for aircraft are subject to significant vibration. Sensors manufactured according to the method of the present invention are less susceptible to damage and failure than known sensors because the, essentially monolithic structure reduces or eliminates stresses caused by differing thermal coefficients of expansion, and the electrode or coil is less susceptible to damage caused by vibrations since the electrically conductive material is fused with the supporting and insulating material of the electrically insulating material.

According to a further aspect of the present invention, there is provided a sensor for a high-temperature environment. The sensor comprises: at least one path of high electrical conductivity formed of electrically conductive material or materials, and defining: at least one electrode or at least one coil; and, at least one elongate portion extending from said at least one electrode or said at least one coil; and at least one portion of low electrical conductivity formed of electrically insulating material or materials, encapsulating the or each path of high electrical conductivity. The or each path of high electrical conductivity and the or each portion of low electrical conductivity are fused to form a monolithic body, wherein the electrically insulating material forms a shield to shield the at least one elongate portion from the external environment.

According to a yet further aspect of the present invention, there is provided a sensor for a high-temperature environment comprising: a series of layers, each layer being formed of electrically insulating material or materials and electrically conductive material or materials, the electrically conductive material or materials is or are deposited on at least a segment of the electrically conductive material or materials of the previous layer so as to form at least one path of high electrical conductivity extending through the layers, the at least one path of high electrical conductivity defining: at least one electrode or at least one coil; and at least one elongate portion extending from said at least one electrode or said at least one coil, and the electrically insulating material or materials encapsulate the or each path of high electrical conductivity. The layers of materials are fused to form a monolithic body, wherein said electrically insulating material is deposited such that the at least one elongate portion is shielded from the external environment.

Advantageously, providing a sensor having a monolithic structure improves the durability of the sensor in high temperature, and high vibration, environments.

Where the electrically conductive portion is a coil, the sensor is an inductive sensor. Alternatively, the or each electrically conductive portion may be an electrode.

Where the sensor is a capacitive sensor, the sensor may comprise two paths of high electrical conductivity, the first path of high electrical conductivity being an electrode, and the second path of high electrical conductivity being a guard, or shield, configured to surround the electrode.

The sensor preferably further comprises at least one electrical contact pad, the or each pad electrically coupled to a respective path of high electrical conductivity, and protruding from the portion of low electrical conductivity.

The electrically conductive material or materials that form the at least one elongate portion may electrically connect the at least one electrode or the at least one coil to the at least one electrical contact pad.

The electrically insulating material or materials and the electrically conductive material or materials preferably have a similar coefficient of thermal expansion.

The electrically insulating material or materials and the electrically conductive material or materials preferably have a similar fusing temperature.

The at least one of the electrically conductive material or materials is preferably a metal, more preferably one of: tungsten; platinum; and iridium.

At least one of the electrically conductive material or materials is preferably a ceramic, more preferably one of: silicon carbide; titanium nitride; and molybdenum-disilicide.

The sensor may further comprise a housing, the monolithic body being coupled to the housing.

The sensor according to the present invention is preferably manufactured substantially as described herein.

The present invention extends to a method of producing a sensor for a high-temperature environment substantially as described herein with reference to the attached figures.

Any feature in one aspect of the invention may be applied to other aspects of the invention, in any appropriate combination. In particular, method aspects may be applied to apparatus aspects, and vice versa. Furthermore, any, some and/or all features in one aspect can be applied to any, some and/or all features in any other aspect, in any appropriate combination.

It should also be appreciated that particular combinations of the various features described and defined in any aspects of the invention can be implemented and/or supplied and/or used independently.

The invention will be further described, by way of example only, with reference to the accompanying drawings in which:

FIG. 2a shows a cross-sectional schematic representation of a capacitive sensor according to an embodiment of the present invention;

FIG. 2b shows an alternative view of the sensor of FIG. 2a;

FIG. 3a shows a cross-sectional schematic representation of a capacitive sensor according to a further embodiment of the present invention;

FIG. 3b shows an alternative view of the sensor of FIG. 3a;

FIG. 4a shows a cross-sectional schematic representation of a capacitive sensor according to a yet further embodiment of the present invention;

FIG. 4b shows an alternative view of the sensor of FIG. 4a;

FIG. 5b shows an alternative view of the sensor of FIG. 5a;

Figure 6B:
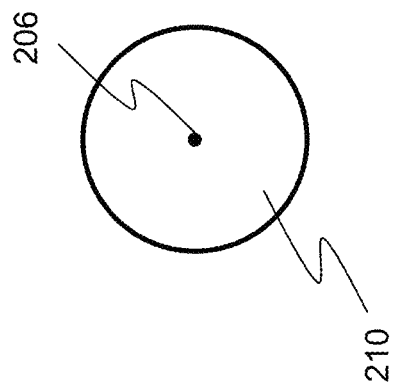
Figure 6A:
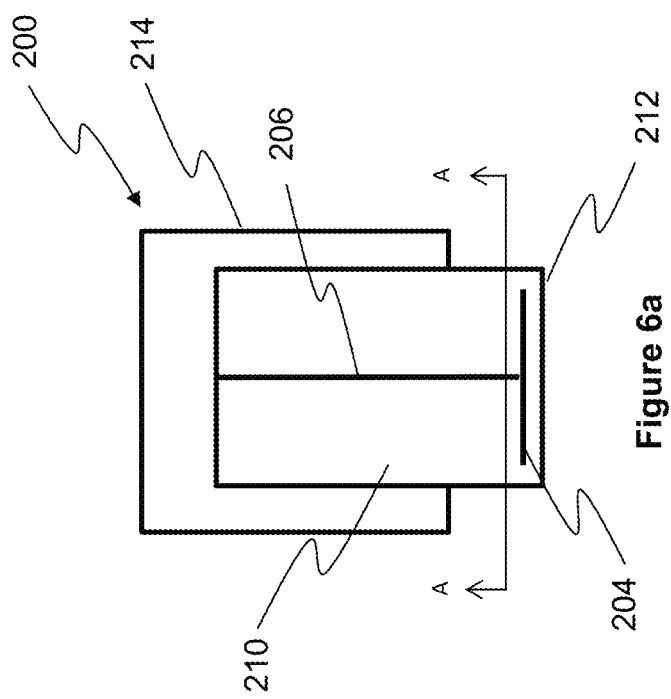

FIG. 6a shows a cross-sectional schematic representation of an inductive sensor according to a still further embodiment of the present invention; and FIG. 6b shows a sectional view along axis A-A of the sensor of FIG. 6a FIG. 7a shows a cross-sectional schematic representation of an inductive sensor according to a still further embodiment of the present invention; and FIG. 7b shows a sectional view along axis B-B of the sensor of FIG. 7a FIG. 8a shows a cross-sectional schematic representation of an inductive sensor according to a still further embodiment of the present invention; and FIG. 8b shows a sectional view along axis C-C of the sensor of FIG. 8a FIG. 9a shows a cross-sectional schematic representation of an inductive sensor according to a still further embodiment of the present invention; and FIG. 9b shows a sectional view along axis D-D of the sensor of FIG. 9a.

Figure 1:
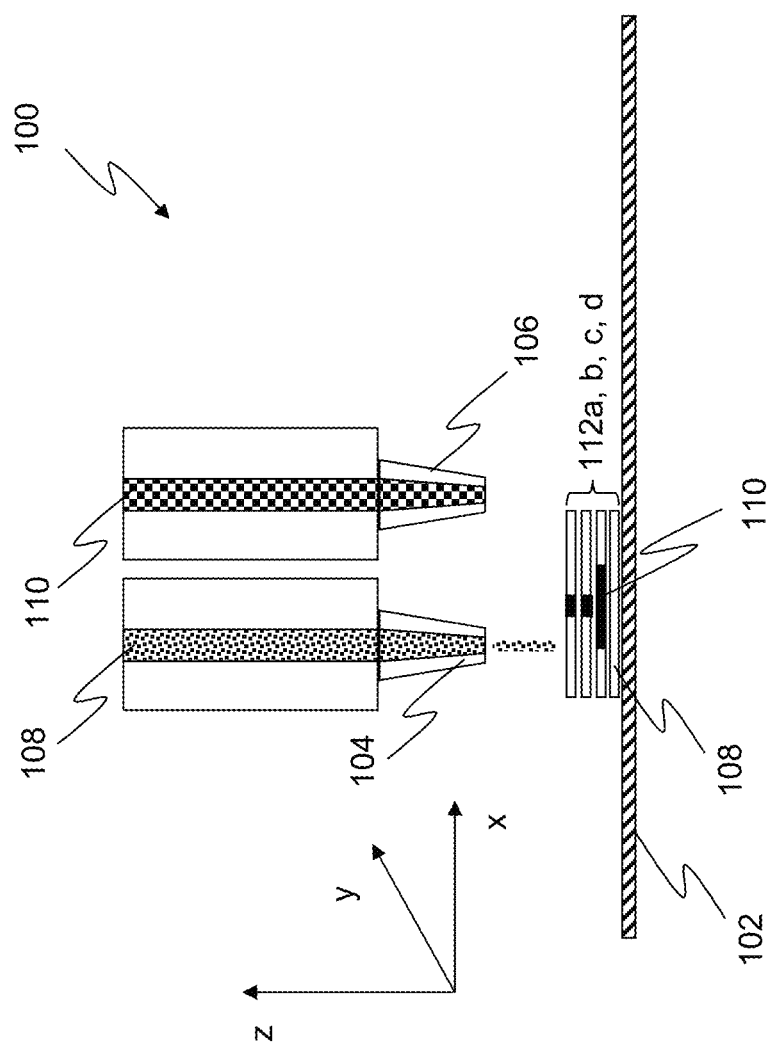
FIG. 1 shows a schematic representation of apparatus used to carry out a method of manufacturing a sensor according to an embodiment of the present invention.

FIG. 1 shows a schematic representation of apparatus 100 used to carry out a method of manufacturing a sensor. For example, the sensor may be for a high temperature environment such as that found in a gas turbine (e.g. a jet engine for aircraft). The manufacturing method is one of additive manufacture using at least two different types of material. As such, the sensor body is built up by depositing multiple layers of material or materials, each layer comprising one or both types of material, and then fusing the material together. The process may therefore be considered similar to colour ink-jet printing where different types of ink, or in the present case material, are printed. The step of fusing the materials together comprises sintering the materials at a high temperature. Such a method produces a substantially monolithic sensor body capable of withstanding the high temperature environment of a gas turbine. The method will now be described in further detail and with reference to FIG. 1.

As shown in FIG. 1, the system 100 comprises a base 102, and two material deposition nozzles 104 and 106. The first nozzle 104 is configured to deposit a first material 108, and the second nozzle 106 is configured to deposit a second material 110. The first material 108 is an electrically insulating material (i.e. a material having a low electrical conductivity), and the second material 110 is an electrically conductive material (i.e. a material having a high electrical conductivity).

The nozzles 104 and 106 are positionable in the X-Y plane, and the base 102 is positionable in the Z-direction. In this way, the materials 108 and 110 may be accurately deposited.

As can be seen, the method comprises depositing the materials 108 and 110 in a series of layers 112, each layer comprising the electrically conductive material 110 and/or the electrically insulating material 108. As will be appreciated, more than one electrically conductive material may be used, and, similarly, more than one electrically insulating material may be used. The first layer 112a comprises only the electrically insulating material 108 to form a front face of the sensor. When used in a gas turbine, this front face will be exposed to the gas stream. As will be appreciated, more than one layer comprising only electrically insulating material may be deposited, depending on the requirements of the particular sensor. As will also be appreciated, more than one substantially identical layer comprising both electrically insulating material, and electrically conductive material may be provided consecutively to result in the required form of the sensor.

The remaining layers 112b, 112c and 112d comprise both electrically insulating material 108 and electrically conductive material 110. The electrically conductive material 110 in layer 112b is formed as an electrode plate, and is surrounded by the electrically insulating material 108 in that layer. The next layer 112c also comprises electrically conductive material 110 surround by electrically insulating material 108. The electrically conductive material in layer 112c is deposited such that it is in contact with the electrically conductive material 110 in layer 112b. The layers 112 are successively deposited in this way until the sensor body is completed. As will be appreciated from the following examples of types of sensor which this method can produce, other arrangements of electrically conductive material and electrically insulating material in each layer are envisaged.

When all layers 112 have been deposited to complete the sensor body, they are fused together to form the completed, monolithic, sensor body. The layers of material are preferably fused together in a sintering process. Alternatively, each layer may be fused before the next layer is deposited. In this alternative, the material may be fused using a laser or an electron beam, and the material may either be sintered or melted together.

The electrically insulating material 108 is a ceramic material resistant to thermal shock, and has mechanical properties suitable for being used in a gas turbine. The ceramic material may be any one of: alumina; silicon nitride; aluminium nitride; and SiAlONs. SiAlONs are ceramic alloys based on the elements silicon (Si), aluminium (Al), oxygen (O) and nitrogen (N).

The electrically conductive material 110 may be a metal, such as tungsten, platinum, or iridium. The electrically conductive material 110 may be an electrically conductive ceramic, such as silicon carbide. The silicon carbide may be formed as a n-type semiconductor doped with one of: nitrogen and phosphorus. Alternatively, the silicon carbide may be formed as a p-type semiconductor doped with one of: aluminium; boron; gallium; and beryllium. The electrically conductive ceramic material 110 may alternatively be one of: titanium nitride; and molybdenum-disilicide. Any other suitable electrically conductive material may be used.

FIGS. 2 to 9 show various forms and types of sensor which may be manufactured according to the method described above. As will be appreciated by the person skilled in the art, other forms and types of sensor may be manufactured by the method of the present invention. In each example, it can be seen that the electrically insulating material of the monolithic body forms a protective shield, configured to protect the electrically conducting material from the external environment (for example, the turbine exhaust gas). By both forming a monolithic body, and configuring the electrically insulating material to form a protective shield, a high-temperature sensor may be formed.

The sensor 200 of FIGS. 2a and 2b is a capacitive type, co-axial, sensor. FIG. 2a shows a cross-sectional view of the sensor 200, and FIG. 2b shows a view of the front face of the sensor 200. As will be appreciated, FIG. 2b shows a schematic representation of the front face of the sensor 200, and as such the sensor is shown as if the front face were clear to enable internal features to be visible. The sensor 200 comprises an electrically conductive portion 202, comprising an electrode plate 204, a wire (elongate conductive portion) 206, and an electrical contact pad 208. The elongate conductive portion 206 electrically connects the electrode plate 204 to the electrical contact pad 208. The electrically conductive portion 202 is surrounded by an electrically insulating portion 210. The sensor body has a front face 212 formed from electrically insulating material. The sensor is manufactured as described above, and so the electrically conductive portion 202 and the electrically insulating portion 210 are fused together to form a substantially monolithic sensor body. The sensor body is provided in a housing 214, the housing being configured to be mounted in, for example, a gas turbine.

FIGS. 3a and 3b show an alternative capacitive type, tri-axial sensor 300. The sensor 300 is similar to that described above with reference to FIGS. 2a and 2b. As will be appreciated, FIG. 3b shows a schematic representation of the front face of the sensor 300, and as such the sensor is shown as if the front face were clear to enable internal features to be visible. The sensor 300 comprises a first electrically conductive portion 302, comprising an electrode plate 304, a wire (elongate conductive portion) 306, and a first electrical contact pad 308. The elongate portion 306 electrically connects the first electrical contact pad 308 and the electrode plate 304. The sensor 300 further comprises a second electrically conductive portion 310, comprising an annular portion 312 surrounding the electrode plate 304, a wire portion (elongate conductive portion) 314 and a second electrical contact pad 316. The elongate portion 314 electrically connects the electrode plate 304 to the second electrical contact pad 316. The electrically conductive portions 302 and 310 are surrounded by an electrically insulating portion 318. The sensor body has a front face 320 formed from electrically insulating material. The sensor is manufactured as described above, and so the electrically conductive portions 302 and 310, and the electrically insulating portion 318 are fused together to form a substantially monolithic sensor body. The sensor body is provided in a housing 322, the housing being configured to be mounted in, for example, a gas turbine.

This type of sensor 300 uses the second electrically conductive portion 310 as a guard to prevent the electrode from forming an electric field with anything other than the target directly adjacent the electrode plate 304. The method of manufacture of the present invention is particularly appropriate for forming this type of complex sensor.

FIGS. 4a and 4b show a yet further alternative capacitive type, twin element sensor 400. As will be appreciated, FIG. 4b shows a schematic representation of the front face of the sensor 400, and as such the sensor is shown as if the front face were clear to enable internal features to be visible. The sensor 400 is similar to that described above with reference to FIGS. 3a and 3b. The sensor 400 comprises a first electrically conductive portion 402, comprising an electrode plate 404, a wire (elongate conductive portion) 406, and a first electrical contact pad 408. The sensor 400 further comprises a second electrically conductive portion 410, comprising an electrode plate 412, a wire 414, and a second electrical contact pad 416. The electrically conductive portions 402 and 410 are surrounded by an electrically insulating portion 418. The sensor body has a front face 420 formed from electrically insulating material. The sensor is manufactured as described above, and so the electrically conductive portions 402 and 410, and the electrically insulating portion 418 are fused together to form a substantially monolithic sensor body. The sensor body is provided in a housing 422, the housing being configured to be mounted in, for example, a gas turbine.

This type of sensor 400 uses two electrodes to enable axial movement of, for example, a turbine blade. The method of manufacture of the present invention is particularly appropriate for forming this type of complex sensor having complex shaped electrodes.

Figure 5B:
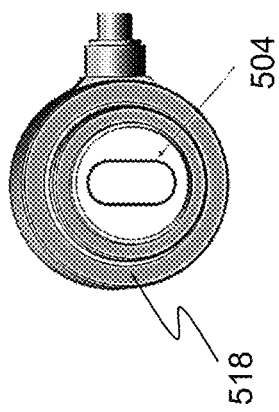
Figure 5A:
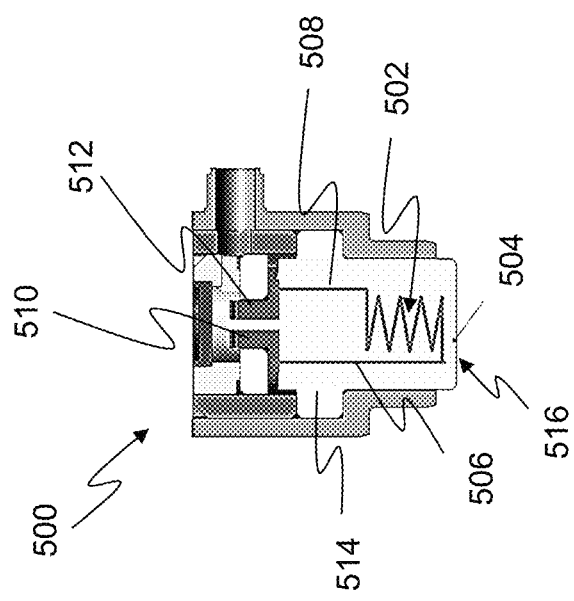
FIG. 5a shows a cross-sectional schematic representation of an inductive sensor according to a still further embodiment of the present invention.

FIGS. 5a and 5b show an inductive type sensor 500. As will be appreciated, FIG. 5b shows a schematic representation of the front face of the sensor 500, and as such the sensor is shown as if the front face were clear to enable internal features to be visible. The sensor 500 comprises a first electrically conductive portion 502, comprising a coil 504, wires (elongate conductive portions) 506 and 508, and electrical contact pads 510 and 512. The electrically conductive portion 502 is surrounded by an electrically insulating portion 514. The sensor body has a front face 516 formed from electrically insulating material. The sensor is manufactured as described above, and so the electrically conductive portion 502, and the electrically insulating portion 514 are fused together to form a substantially monolithic sensor body. The sensor body is provided in a housing 518, the housing being configured to be mounted in, for example, a gas turbine.

The coil 504 has a substantially oval cross-sectional shape, but may be manufactured with any suitable cross-sectional shape.

FIG. 6a and FIG. 6b schematically show the same capacitive type, co-axial, sensor displayed in FIGS. 2a and 2b. FIG. 6b shows that the cross-sectional area of the wire or elongate conductive portion 206 of the electrically conductive portion 202 relative to the cross-sectional area of the surrounding electrically insulating portion 210. The cross-sectional area of the wire 206 is much smaller than the cross-sectional area of the surrounding electrically insulating portion 210 to minimise the stresses caused by differing thermal coefficients of expansion between the electrically insulating material and the electrically conductive material to be minimised.

FIGS. 7a and 7b show an alternative capacitive type sensor 700. The sensor 700 is similar to that described above with reference to FIGS. 2a and 2b. As will be appreciated, FIG. 7b shows a schematic representation of the internal cross-section of the sensor 700, when the sensor 700 is viewed along axis B-B. The sensor 700 comprises an electrically conductive portion 702, comprising an electrode plate 704 and a plurality of wires (elongate conductive portions) 706. The sensor 700 shown in FIGS. 7a and 7b has five wires 706. The electrically conductive portion 702 may comprise one or more electrical contact pads (not shown). The elongate conductive portions 706 electrically connect the electrode plate 704 to one or more electrical contact pads (not shown). The electrically conductive portion 702 is surrounded by an electrically insulating portion 708. The sensor body has a front face 710 formed from electrically insulating material. The sensor 700 is manufactured as described above, and so the electrically conductive portion 702, and the electrically insulating portion 708 are fused together to form a substantially monolithic sensor body. The sensor body is provided in a housing 712, the housing being configured to be mounted in, for example, a gas turbine.

Similarly to the sensor 200 shown in FIGS. 2 and 6, the cross-sectional areas of the wires 706 are substantially smaller than the cross-sectional area of the surrounding electrically insulating portion 708 to minimise the stresses caused by differing thermal coefficients of expansion between the electrically insulating material and the electrically conductive material to be minimised. Additionally, the sensor 700 provides multiple wires 706 to ensure that an electrical connection is maintained should any of the wires 706 fail under thermal stress. The method of manufacture of the present invention is particularly appropriate for forming this type of complex sensor.

FIGS. 8a and 8b show an alternative capacitive type sensor 800. The sensor 800 is similar to that described above with reference to FIGS. 2a and 2b. As will be appreciated, FIG. 8b shows a schematic representation of an internal cross-section of the sensor 800, when the sensor 800 is viewed along axis C-C. The sensor 800 comprises an electrically conductive portion 802, comprising an electrode plate 804 and an elongate conductive portion 806. The elongate conductive portion 806 electrically connects the electrical contact pad (not shown) and the electrode plate 804. The cross-sectional area of the conductive portion 806 forms a curved contour 810. The curved contour 810 shown in FIG. 8b is in the form of an open curve. Alternatively, the curved contour 810 may be also provided as closed curve or shape. The electrically conductive portion 802 may comprise one or more electrical contact pads (not shown). The electrically conductive portion 802 is surrounded by an electrically insulating portion 808. The sensor body has a front face 812 formed from electrically insulating material 808. The sensor 800 is manufactured as described above, and so the electrically conductive portion 802, and the electrically insulating portion 808 are fused together to form a substantially monolithic sensor body. The sensor body is provided in a housing 814, the housing being configured to be mounted in, for example, a gas turbine.

Similarly to the sensor 200 shown in FIGS. 2 and 6, the cross-sectional area of the curved contour 810 of the elongate conductive portion 806 is substantially smaller than the cross-sectional area of the surrounding electrically insulating portion 808 to minimise the stresses caused by differing thermal coefficients of expansion between the electrically insulating material and the electrically conductive material to be minimised. The method of manufacture of the present invention is particularly appropriate for forming this type of complex sensor.

Finally, FIGS. 9a and 9b show an alternative capacitive type sensor 900. The sensor 900 is similar to that described above with reference to FIGS. 2a and 2b. As will be appreciated, FIG. 9b shows a schematic representation of an internal cross-section of the sensor 900, when the sensor 900 is viewed along axis D-D. The sensor 900 comprises an electrically conductive portion 902, comprising an electrode plate 904 and a wire (elongate conductive portion) 906. The elongate conductive portion 906 electrically connects the electrical contact pad (not shown) and the electrode plate 904. The electrode plate 904 comprises a plurality of through holes 910. The cross-sectional area of each through hole 910 is substantially smaller than the cross-sectional area of the electrode plate 904. Alternatively, the electrode plate 904 may comprise one or more slots. The electrically conductive portion 902 may comprise one or more electrical contact pads (not shown). The electrically conductive portion 902 is surrounded by an electrically insulating portion 908. The sensor body has a front face 912 formed from electrically insulating material. The sensor 900 is manufactured as described above, and so the electrically conductive portion 902, and the electrically insulating portion 908 are fused together to form a substantially monolithic sensor body. The sensor body is provided in a housing 914, the housing being configured to be mounted in, for example, a gas turbine.

During manufacture, the electrically insulating material will fill the through holes 910 or slots of the electrode plate 904. Therefore, the through holes 910 or slots of the electrode plate 904 further improves the minimisation of stresses caused by differing thermal coefficients of expansion already achieved by the sensor 200 shown in FIGS. 2 and 6. The method of manufacture of the present invention is particularly appropriate for forming this type of complex sensor. Alternatively, the sensor 900 can be formed starting from the perforated electrode plate 904 and, subsequently, the front face 912 can be fused to the rest of the sensor 900 to form the monolithic structure.

All of the sensors described above with reference to FIGS. 2 to 9 are, in use, electrically coupled, via the electrical contact pads, to control circuitry for controlling the sensor and receiving the output of the electrode or coil.

The invention claimed is:

1. A method of additively manufacturing a capacitive sensor for a high-temperature environment, comprising the steps of:
   depositing one or more electrically insulating material to form at least one portion of a layer with low electrical conductivity;
   depositing one or more electrically conductive material to form at least one further portion of the layer with high electrical conductivity;
   depositing successive layers in forming a capacitive sensor, each layer being additively formed of portions of high electrical conductivity and low electrical conductivity, wherein the electrically conductive material or materials is or are deposited on at least a segment of the electrically conductive material or materials in the previous layer so as to form at least one path of high electrical conductivity extending through the layers, said at least one path of high electrical conductivity defining:
      at least one electrode; and
      at least one elongate portion extending from said at least one electrode; and
   fusing the materials to form the capacitive sensor with a monolithic structure, wherein said electrically insulating material is deposited such that the at least one elongate portion is shielded from the external environment.

2. A method according to claim 1, further comprising, depositing one or more electrically insulating material to form one or more initial continuous layers of low electrical conductivity, the continuous layer or layers forming a front face of the sensor.

3. A method according to claim 1, wherein the electrically conductive material or materials is or are deposited in such a way as to form a plurality of paths of high electrical conductivity extending through the layers.

4. A method according to claim 1, wherein the electrically conductive material or materials is or are deposited in such a way as to form a guard around said electrode.

5. A method according to claim 1, wherein the electrically conductive material or materials is or are deposited in such a way as to form at least one electrical contact pad.

6. A method according to claim 5, wherein the or each contact pad is in electrical connection with a corresponding electrode.

7. A method according to claim 6, wherein the at least one elongate portion electrically connects the at least one electrode to said at least one electrical contact pad.

8. A method according to claim 1, wherein the electrically insulating material or materials and the electrically conductive material or materials of each layer are deposited substantially simultaneously.

9. A method according to claim 1, wherein the electrically insulating material or materials and the electrically conductive material or materials of each layer are deposited sequentially.

10. A method according to claim 1, wherein the step of fusing the materials comprises sintering or melting the materials, the sintering or melting the or each material using at least one of: a laser; and an electron beam.

11. A method according to claim 10, wherein the electrically insulating material or materials and the electrically conductive material or materials have similar sintering temperatures.

12. A sensor for a high-temperature environment, the sensor being a capacitive sensor and manufactured using an additive process, comprising:
a capacitive sensor having at least one path of high electrical conductivity additively formed of electrically conductive material or materials, and defining:
at least one electrode;
at least one elongate portion extending from said at least one electrode; and
at least one portion of low electrical conductivity formed of electrically insulating material or materials, encapsulating the or each path of high electrical conductivity;
wherein, the or each path of high electrical conductivity and the or each portion of low electrical conductivity are fused to form the capacitive sensor with a monolithic body, wherein said electrically insulating material forms a shield to shield the at least one elongate portion from the external environment.

13. A sensor for a high-temperature environment, the sensor being a capacitive sensor and manufactured using an additive process, comprising:
a capacitive sensor having a series of layers, each layer being additively formed of electrically insulating material or materials and electrically conductive material or materials, whereby the electrically conductive material or materials is or are deposited on at least a segment of the electrically conductive material or materials of the previous layer so as to form at least one path of high electrical conductivity extending through the layers, the at least one path of high electrical conductivity defining:
at least one electrode; and
at least one elongate portion extending from said at least one electrode, and the electrically insulating material or materials encapsulate the or each path of high electrical conductivity;
wherein the layers of materials are fused to form the capacitive sensor with a monolithic body, wherein said electrically insulating material is deposited such that the at least one elongate portion is shielded from the external environment.

14. A sensor according to claim 13, comprising another path of high electrical conductivity being a guard configured to surround the electrode.

15. A sensor according to claim 13, further comprising at least one electrical contact pad, the or each pad being electrically coupled to a respective path of high electrical conductivity, and protruding from the portion of low electrical conductivity.

16. A sensor according to claim 15, wherein the at least one elongate portion electrically connects the at least one electrode or the at least one coil to said at least one electrical contact pad.

17. A sensor according to claim 13, wherein the electrically insulating material or materials and the electrically conductive material or materials have a similar fusing temperature.

* * * * *